United States Patent
Ke et al.

(10) Patent No.: US 12,165,851 B2
(45) Date of Patent: Dec. 10, 2024

(54) PLASMA PROCESSING METHOD FOR MANUFACTURING SEMICONDUCTOR STRUCTURE

(71) Applicant: TAIWAN SEMICONDUCTOR MANUFACTURING COMPANY, LTD., Hsinchu (TW)

(72) Inventors: Yu-Lun Ke, Hsinchu (TW); Yu-Chi Lin, Hsinchu (TW); Yi-Tsang Hsieh, Hsinchu (TW); Yu-Hsi Tang, Yunlin County (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 545 days.

(21) Appl. No.: 17/388,875

(22) Filed: Jul. 29, 2021

(65) Prior Publication Data
US 2023/0036955 A1 Feb. 2, 2023

(51) Int. Cl.
*H01J 37/32* (2006.01)
*H01L 21/311* (2006.01)

(52) U.S. Cl.
CPC .. *H01J 37/32642* (2013.01); *H01J 37/32082* (2013.01); *H01J 37/32724* (2013.01); *H01J 37/32935* (2013.01); *H01L 21/31116* (2013.01); *H01J 2237/24585* (2013.01); *H01J 2237/3321* (2013.01); *H01J 2237/3343* (2013.01)

(58) Field of Classification Search
CPC ............. H01J 2237/24585; H01L 21/31116
See application file for complete search history.

(56) References Cited

U.S. PATENT DOCUMENTS

| | | | | |
|---|---|---|---|---|
| 2019/0108986 A1* | 4/2019 | Saitoh | ............... | H01J 37/32724 |
| 2020/0176224 A1* | 6/2020 | Ju | ..................... | H01J 37/32724 |
| 2021/0020408 A1* | 1/2021 | Sugiyama | ......... | H01J 37/32642 |

* cited by examiner

*Primary Examiner* — Binh X Tran
(74) *Attorney, Agent, or Firm* — Birch, Stewart, Kolasch & Birch, LLP

(57) ABSTRACT

A method for manufacturing a semiconductor structure includes disposing a wafer in a processing chamber, in which the wafer is laterally surrounded by a focus ring. A plasma is formed in the processing chamber to process the wafer. A thickness of the focus ring is detected. A plasma direction of the plasma over a peripheral region of the wafer is adjusted according to the thickness of the focus ring.

20 Claims, 13 Drawing Sheets

PLASMA PROCESSING METHOD FOR MANUFACTURING SEMICONDUCTOR STRUCTURE

BACKGROUND

In the manufacturing of integrated circuits, patterning techniques such as photolithography and etching are used to form various features such as polysilicon lines, devices (e.g., transistors, diodes, and the like), interconnect structures, contact pads, and the like in device dies on a wafer. As design features in integrated circuits become increasingly complex (e.g., having smaller critical dimensions and/or more complex shapes), complex patterning processes may be used to form a single feature. However, due to process limitations, critical dimensions of the various patterned features may not be uniform within a wafer, which may degrade the performance of the device/die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
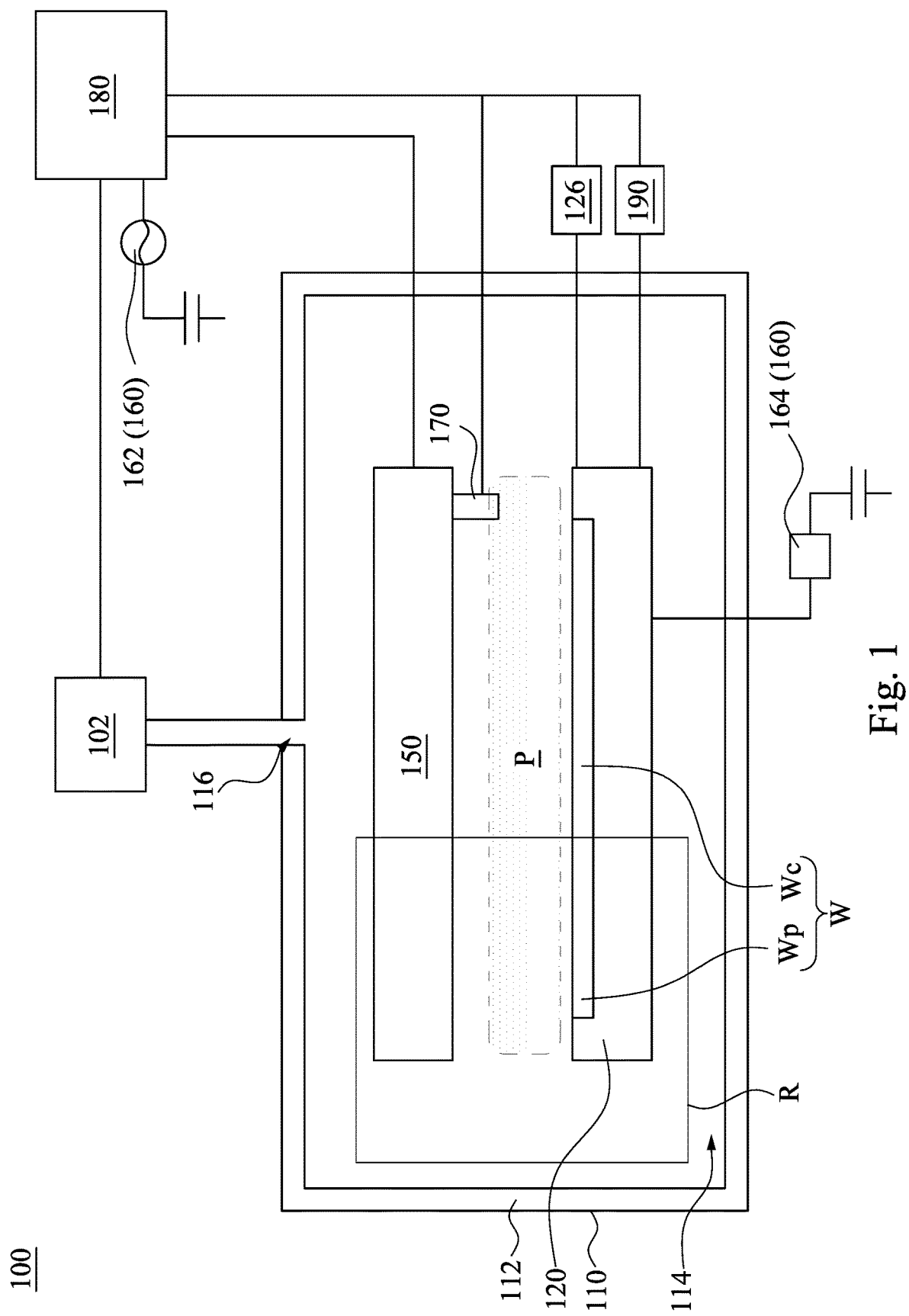
FIG. 1 is a schematic view of a plasma processing apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is related to a method for an etching process. More particularly, some embodiments of the present disclosure are related to improve plasma uniformity in wafer patterning and/or layer depositing. The embodiments such as those disclosed herein are applicable not only to front-end-of-line (FEOL) processing but also to middle-end-of-line (MEOL) processing and back-end-of-line (BEOL) processing.

Figure 2:
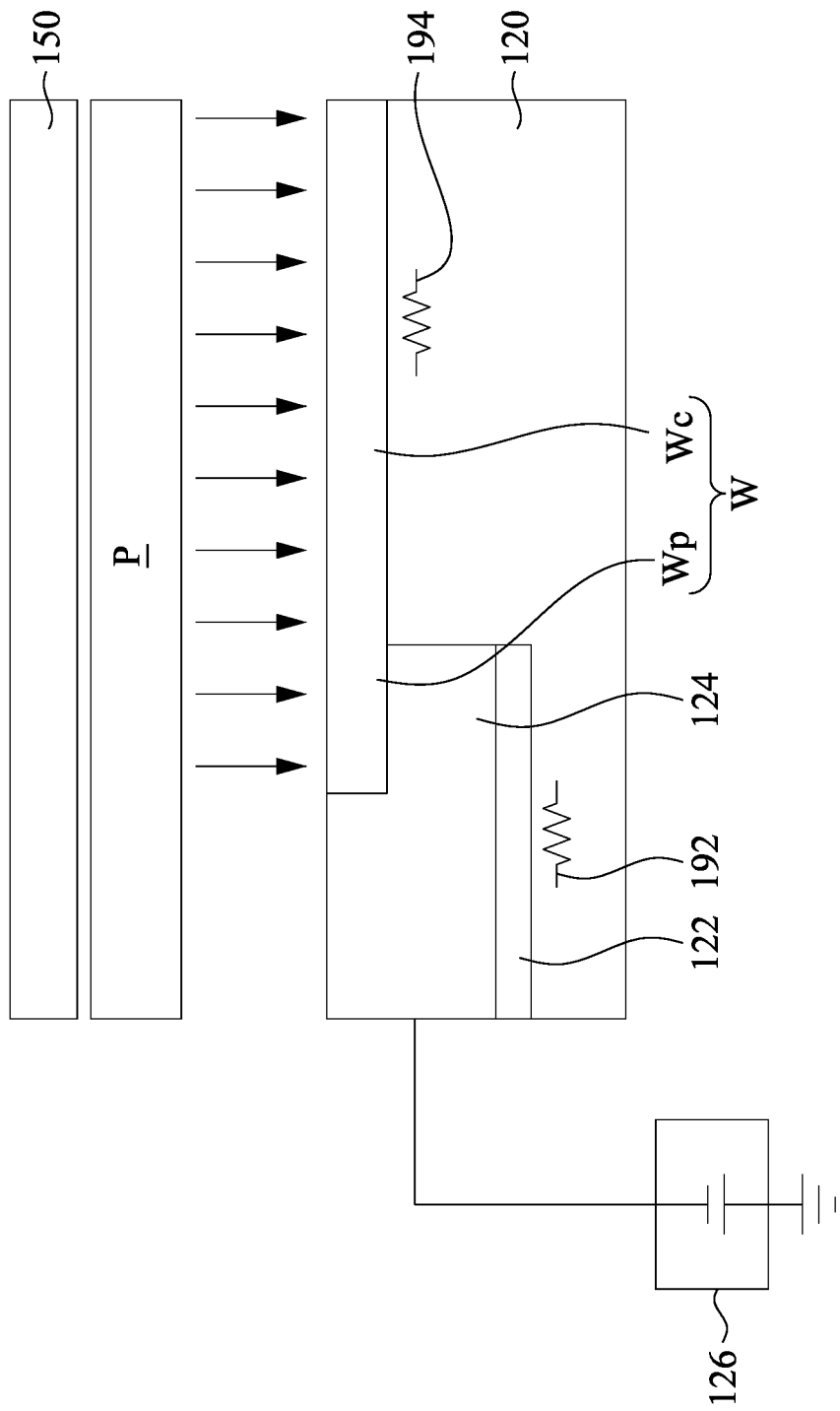
FIG. 2 is a partially enlarged view of FIG. 1.

FIG. 1 is a schematic view of a plasma processing apparatus 100 in accordance with some embodiments, and FIG. 2 is a partially enlarged view of a region R in FIG. 1. The plasma processing apparatus 100 is configured to etch one or more wafers W. In some embodiments, the wafer W is positioned for etching by plasma P generated by a first DC/AC RF source 160. The wafer W includes a center region Wc and a peripheral region Wp surrounds the center region Wc. In some embodiments, the plasma processing apparatus 100 includes a processing chamber 110, a pedestal 120, a top electrode 150, the first DC/AC RF source 160, a sensing module 170, a control module 180, and a temperature controller 190.

Reference is made to FIG. 1 and FIG. 2. The processing chamber 110 has at least one sidewall 112. The sidewall 112 defines an accommodating space 114 in the processing chamber 110 to accommodate the wafer W. The processing chamber 110 further has an inlet port 116. The inlet port 116 is configured for admission of process gas into the processing chamber 110 from an external process gas source 102.

The pedestal 120 is disposed in the processing chamber 110 to support the wafer W. In some embodiments, the pedestal 120 is an electrostatic chuck (ESC). The pedestal 120 may be rotatable. The pedestal 120 includes a dielectric sheet 122, a focus ring 124, and an edge electric field generator 126. The focus ring 124 covers the dielectric sheet 122 and disposed adjacent to the peripheral region Wp of the wafer W. Specifically, a portion (e.g., an edge portion) of the peripheral region Wp of the wafer W is embedded in the focus ring 124. The focus ring 124 is configured to extend a plasma direction of the plasma P, such that a plasma concentration of the plasma P over the peripheral region Wp of the wafer W is substantially equal to a plasma concentration of the plasma P over the central region Wc of the wafer. The edge electric field generator 126 is electrically connected to the focus ring 124 and may be disposed at an edge of the focus ring 124. The edge electric field generator 126 may be a DC generator. In some embodiments, the dielectric sheet 122 is made of polyimide or other suitable materials. In some embodiments, the focus ring 124 is ring-shaped. The focus ring 124 and the wafer W may be made of the same materials, such as silicon.

The first DC/AC RF source 160 includes an RF source 162 and a biasing element 164. The biasing element 164 is connected to a conductive sheet (not shown) of the pedestal 120. When a desired voltage (desired bias) is applied to the conductive sheet of the pedestal 120 from the biasing element 164, a Coulomb force is generated between the wafer W and the conductive sheet of the pedestal 120 which attracts and holds the wafer W on the pedestal 120.

The top electrode 150 is disposed in the processing chamber 110 and over the pedestal 120. The conductive sheet of the pedestal 120 and the top electrode 150 are coupled with the RF source 162 of the first DC/AC RF source 160 which in turn is controlled by the control module 180. A desired voltage applied to the conductive sheet of the pedestal 120 and the top electrode 150 ionizes the process gas introduced into the processing chamber 110 to create the plasma P within the processing chamber 110 used in etching the wafer W. In other words, the first DC/AC RF source 160 generates RF electromagnetic field to convert the process gas between the top electrode 150 and the pedestal 120 into the plasma P for etching the wafer W.

The sensing module 170 is disposed in the processing chamber 110. In some embodiments, the sensing module 170 is disposed over the edge of the wafer W. For example, the sensing module 170 is fixed on the sidewall 112 of the processing chamber 110 or on the top electrode 150. The sensing module 170 is configured to sense a plasma concentration over the edge of the wafer W. In some embodiments, the sensing module 170 is an optical emission spectroscopy (OES) which provides the capability of monitoring the plasma chemistry reactions by a non-invasive method. OES is an in-situ sensor for plasma process monitoring, which does not interfere with the plasma P. OES detects the plasma emission lights in the processing chamber 110. The plasma emission lights have rich information about the plasma species, which can be used to monitor the etching rate, uniformity, selectivity, critical dimensions, and even the profile of etching features on the wafer W. It is noted that the OES is an example, and does not limit the present disclosure.

The control module 180 is electrically connected to the first DC/AC RF source 160, the top electrode 150, the sensing module 170 and the edge electric field generator 126. The control module 180 is configured to control the power of the first DC/AC RF source 160. Furthermore, the control module 180 is further configured to control the power of the edge electric field generator 126 according to the plasma concentration detected by the sensing module 170, and the controlling processes will be discussed in more detail below in FIG. 3.

The temperature controller 190 is connected to the control module 180, such that the temperature controller 190 controls the temperatures of the pedestal 120. In greater details, the temperature controller 190 includes a first heater 192 and a second heater 194. The first heater 192 is disposed below the focus ring 124, and the second heater 194 is disposed below the central region Wc of the wafer W. The first heater 192 is spaced apart from the second heater 194, and the control module 180 can individually control the first heater 192 and the second heater 194.

Figure 3:
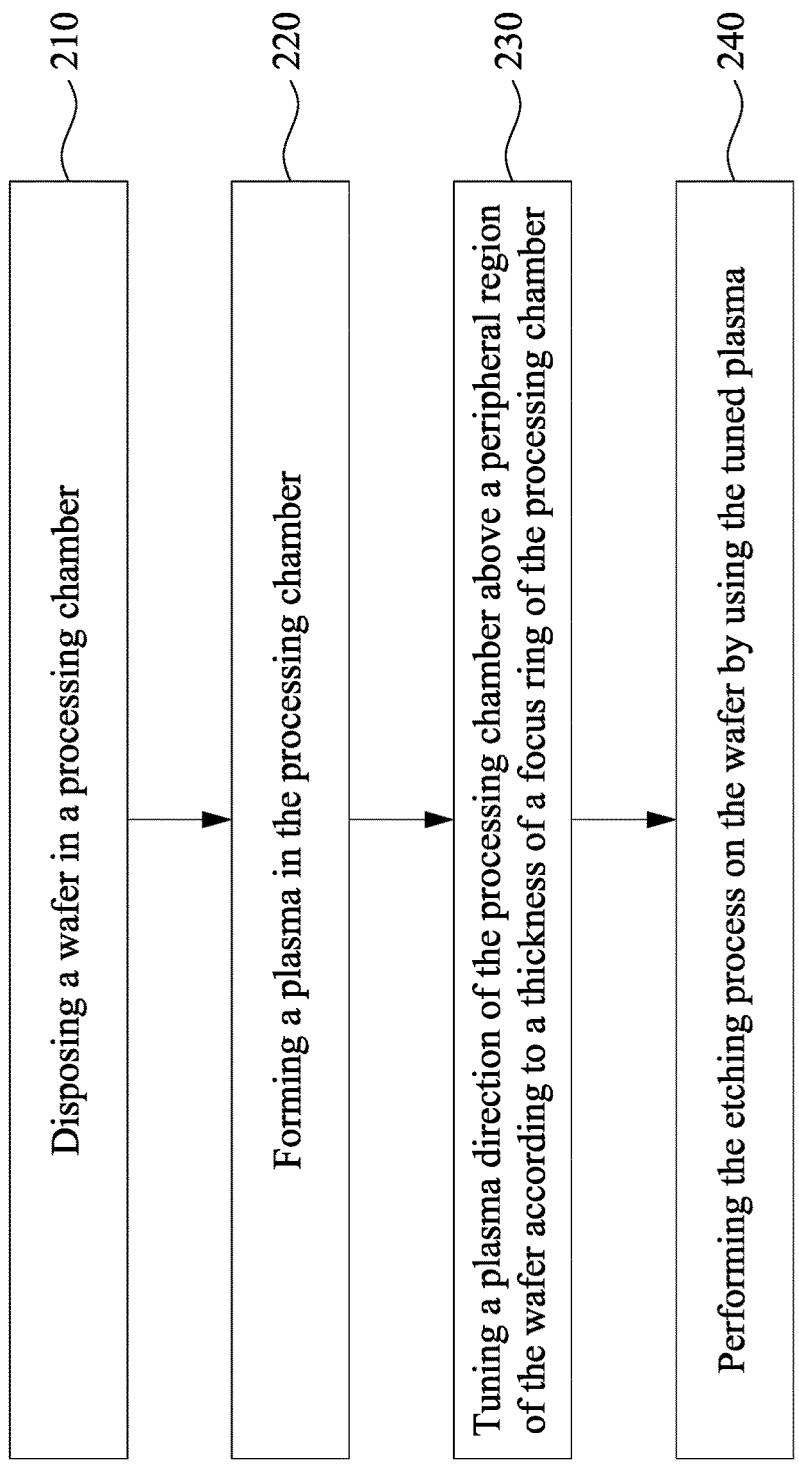
FIG. 3 is a flow chart of a method of an etching process in accordance with some embodiments of the present disclosure.

Illustrated in FIG. 3 is a flow chart of a method 200 of an etching process in accordance with some embodiments of the present disclosure. The method 200 is merely an example and is not intended to limit the present disclosure beyond what is explicitly recited in the claims. Additional operations can be provided before, during, and after the method 200, and some operations described can be replaced, eliminated, or moved around for additional embodiments of the process. For clarity and ease of explanation, some elements of the figures have been simplified. Reference is made to FIGS. 1, 2, and 3. As shown in operation 210 of FIG. 3, a wafer W is deposited in a processing chamber 110. In greater details, the wafer W is disposed on the pedestal 120 of the plasma processing apparatus 100. The first DC/AC RF source 160 may provide a desired voltage to the pedestal 120, and the wafer W is attracted on the pedestal 120.

The method 200 proceeds to operation 220 where a plasma is formed in the processing chamber 110. Reference is made to FIG. 1 and FIG. 2. The plasma P is formed in the processing chamber 110 by introducing a process gas in the processing chamber 110. In some embodiments, the process gas may be chlorine ($Cl_2$), hydrogen bromide (HBr), tetrafluoromethane ($CF_4$), oxygen ($O_2$), nitrogen ($N_2$), or other suitable gases. The type of the process gas depends on the materials desired to be etched. The first DC/AC RF source 160 may generate RF electromagnetic field to convert the process gas between the top electrode 150 and the pedestal 120 into the plasma P for etching the wafer W.

In some embodiments, during an etching process, the plasma P not only etches the materials on the wafer W, but also etches the focus ring 124 since the focus ring 124 is exposed to the plasma P. With an etching time of the etching process increased, the plasma direction is changed because of the focus ring 124 consumed, thereby producing nonuniform plasma distribution in the processing chamber 110. For example, the plasma concentration of the plasma P over the center portion Wc of the wafer W is higher than the plasma concentration of the plasma P over the peripheral portion Wp of the wafer W, and thus an etching rate regarding the peripheral portion Wp will be lower than the etching rate regarding the center portion Wc, and/or the etching direction regarding the peripheral portion Wp will be different from the etching direction regarding the center portion Wc.

The embodiments of the present disclosure solve issues in existing approaches by controlling the RF electromagnetic field over the peripheral region Wp of the wafer W according to the thickness of the focus ring 124. The method 200 proceeds to operation 230 where a plasma direction of the processing chamber 110 above a peripheral region Wp of the wafer W is tuned according to a thickness of a focus ring 124 of the processing chamber 110.

In some embodiments, at operation 230, the plasma direction of the plasma processing apparatus 100 above the peripheral region Wp of the wafer may be tuned by using a detecting heater duty ratio technique. A heater duty is an output power of heaters (e.g., the first heater 192 and the second heater 194 in this case) and the heater duty is response to a target temperature. In some embodiments, the heater duty and the target temperature have a positive correlation (e.g., linear relationship). In addition, a heater duty ratio is a ratio of a targeted output power at a specific hours and an initial output power, in which the temperature is the same. In some embodiments, the heater duty ratio and the etching time have a positive correlation (e.g., linear relationship). That is, as the processing time (etching time) of the plasma processing apparatus 100 increases, the heater duty ratio of the first heater 192 and/or the second heater 194 increases. Moreover, as the processing time (etching time) of the plasma processing apparatus 100 increases, greater amount of the plasma P etches the focus ring 124, such that the thickness of the focus ring 124 reduces as the processing time (etching time) increases. In some embodiments, the etching time and the thickness of the focus ring 124 have a positive correlation (e.g., linear relationship). As such, the thickness of the focus ring 124 can be interpreted from detecting the heater duty ratio since the thickness of the focus ring 124 is associated with the heater duty ratio (e.g., a positive correlation or a linear relationship therebetween).

The heater duty ratio technique may include following operations. First, a predetermined heater duty ratio is determined. In some embodiments, the predetermined heater duty ratio is a heater duty ratio of the temperature controller 190 of a new plasma processing apparatus 100 (e.g., the processing/etching time is about 0). Thereafter, a targeted heater duty ratio is detected. In some embodiments, the pedestal 120 is connected to a sensor to detect a temperature of the focus ring 124 and a temperature of the peripheral region Wp of the wafer W, and then the targeted heater duty ratio can be interpreted. In some other embodiments, sensors are disposed in the first heater 192 and/or the second heater 194 to detect the temperature of the focus ring 124 and/or the temperature of the peripheral region Wp of the wafer W, and then the targeted heater duty ratio can be interpreted. If the targeted heater duty ratio is lower than the predetermined heater duty ratio, the edge electric field generator 126 is applied to apply an electric field above the focus ring 124 to adjust the plasma direction such that the plasma concentration/direction over the peripheral region Wp of the wafer W is substantially equal to the plasma concentration/direction over the central region Wc of the wafer W.

In some embodiments, at operation 230, the plasma direction of the processing chamber 110 above the peripheral region Wp of the wafer W may be tuned by using a detecting etching rate technique. The etching rate of the peripheral region Wp of the wafer W and the thickness of the focus ring 124 may have a positive correlation (e.g., linear relationship). As such, the thickness of the focus ring 124 can be interpreted from detecting the etching rate of the peripheral region Wp of the wafer W.

Figure 4C:
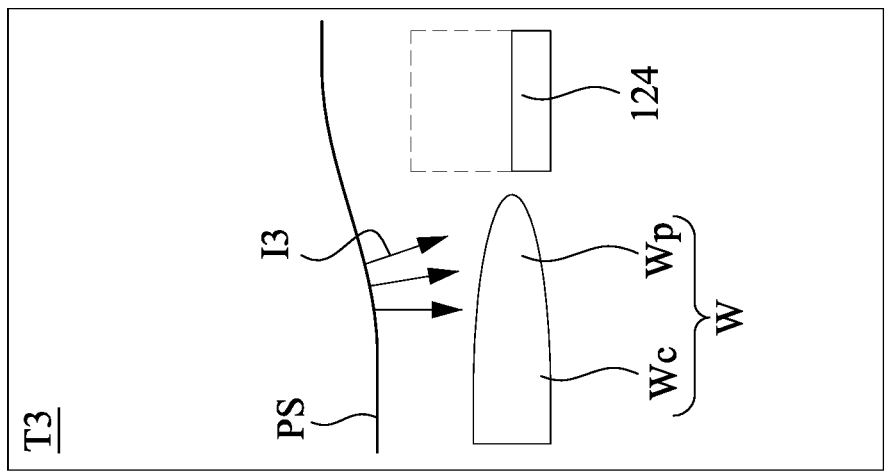
FIGS. 4A to 4C illustrate a method of an etching process at various stages in accordance with some embodiments of the present disclosure.
Figure 4B:
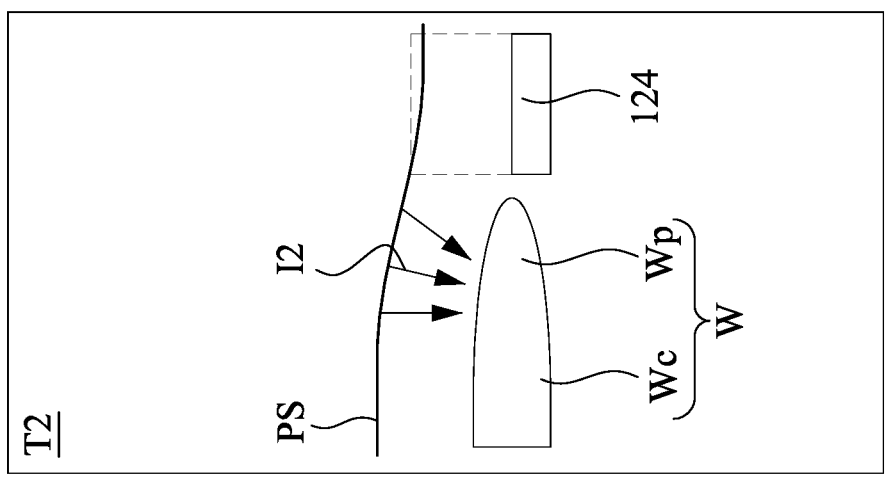
Figure 4A:
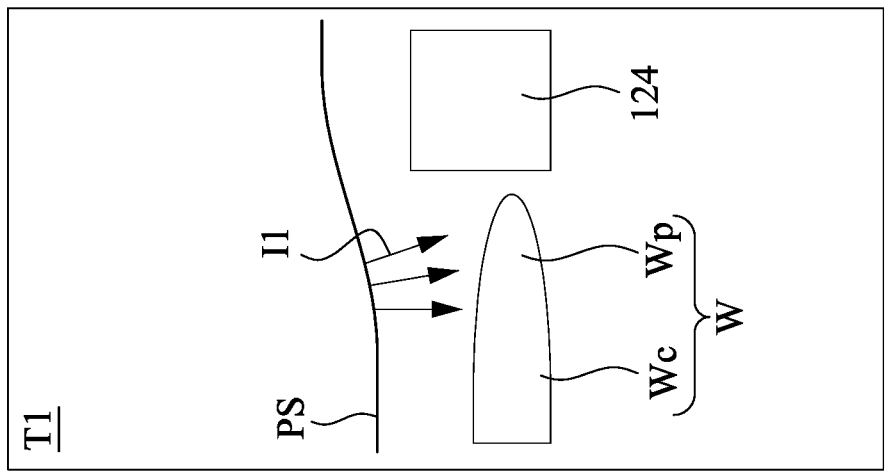

Reference is made on FIGS. 4A to 4C. The focus ring 124 is disposed adjacent to the peripheral region Wp of the wafer W. It is noted that the wafer W in FIGS. 4A to 4C is a testing wafer or a device wafer, the present disclosure is not limited in this regard. As shown in FIG. 4A, an etching process is performed in the processing chamber 110 (see FIG. 1) at time T1, in which time T1 is referred as an initially time of the etching process. Since the focus ring 124 is fresh, a plasma direction I1 is injected toward both the peripheral region Wp of the wafer W and the central region Wc of the wafer. As such, a plasma concentration over the peripheral region Wp of the wafer W is substantially equal to a plasma concentration over the central region Wc of the wafer W. In some embodiments, a plasma sheath PS is formed over the focus ring 124 and the wafer W, and a portion of the plasma sheath PS over the focus ring 124 is above a portion of the wafer W.

As shown in FIG. 4B, the etching process is performed in the processing chamber 110 (see FIG. 1) at time T2, in which time T2 is greater than time T1. The focus ring 124 is consumed during a period between time T2 and time T1, such that a thickness of the focus ring 124 at time T2 is smaller than a thickness of the focus ring 124 at time T1. Since the thickness of the focus ring 124 is decreased, a plasma direction I2 is injected toward the central region Wc of the wafer. In other words, the plasma direction I2 injected toward the peripheral region Wp of the wafer W is decreased. As such, the plasma concentration over the peripheral region Wp of the wafer W is smaller than the plasma concentration over the central region Wc of the wafer. Due to the difference in plasma concentration, the etching profile of the peripheral region Wp and the etching profile of the of the central region Wc of the wafer may be different and nonuniform, and thus the peripheral region Wp of the wafer W would be shifted. In some embodiments, the portion of the plasma sheath PS over the focus ring 124 is below the portion of the wafer W.

As shown in FIG. 4C, the etching process is performed in the processing chamber 110 (see FIG. 1) at time T3, in which time T3 is greater than or substantially equal to time T1. The detecting etching rate technique is used and a voltage (bias) is applied to adjust the plasma direction I3. For example, the voltage (e.g., DC voltage) is applied by using the edge electric field generator 126 in FIG. 2. As such, even if the focus ring 124 is consumed and a thickness of the focus ring 124 at time T3 is smaller than the thickness of the focus ring 124 at time T1, the plasma direction I3 is adjusted and injected toward both the peripheral region Wp of the wafer W and the central region Wc of the wafer. In some embodiments, the plasma direction I1 is substantially the same as the plasma direction I3. The plasma concentration over the peripheral region Wp of the wafer W is substantially equal to the plasma concentration over the central region Wc of the wafer W. Due to the nonuniformity of the plasma concentration, the shifting problem of the peripheral region Wp of the wafer W can be improved or avoided. In some embodiments, the portion of the plasma sheath PS over the focus ring 124 is above the portion of the wafer W.

The detecting etching rate technique may include following operations. First, a predetermined etching rate is determined. In some embodiments, the predetermined etching rate is an etching rate of a new plasma processing apparatus 100 (e.g., the processing/etching time is about 0). Thereafter, a targeted etching rate at one time (e.g., time T2 in FIG. 4B) is detected. In some embodiments, the sensing module 170 is configured to detect the etching rate of the peripheral region Wp of the wafer W. In some other embodiments, the etching rate of the peripheral region Wp of the wafer W can be interpreted by detecting a depth of trenches (e.g., trenches 360c and 360p in FIG. 9) in etching process. If the targeted etching rate is lower than the predetermined etching rate, the edge electric field generator 126 is applied to adjust the plasma direction such that the plasma concentration over the peripheral region Wp of the wafer W is substantially equal to the plasma concentration over the central region Wc of the wafer W. With such operation, the targeted etching rate is increased and is substantially equal to the predetermined etching rate.

In some embodiments, the operation 220 is performed prior to the operation 230. That is, the plasma is formed prior to the tuning of the voltage of the edge electric field generator 126. In some other embodiments, the operation 220 is performed after the operation 230. That is, the plasma is formed after the tuning of the voltage of the edge electric field generator 126.

The method 200 proceeds to operation 240 where the etching process is performed on the wafer W by using the tuned plasma. The etching process will be described in FIG. 5 to FIG. 10.

Figure 5:
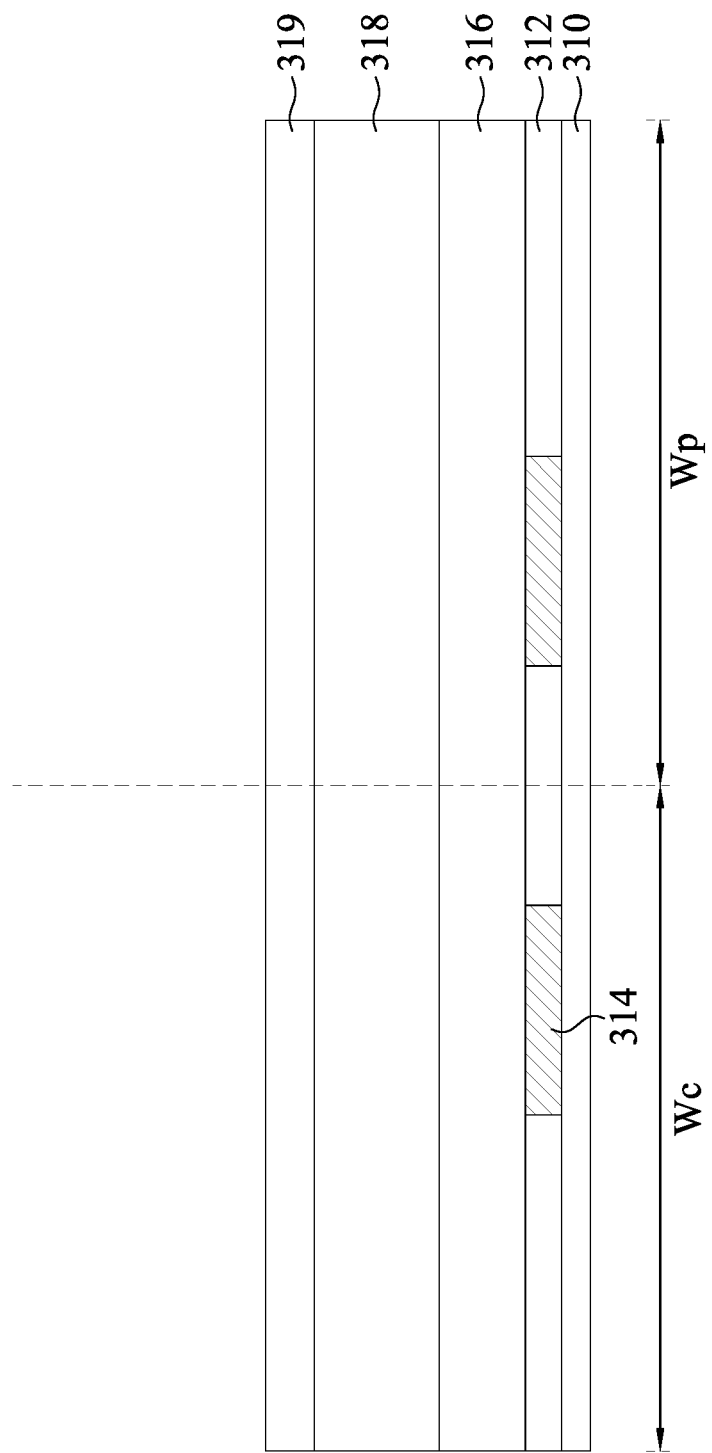
FIGS. 5 to 11 illustrate a semiconductor structure at various stages according to some embodiments.

FIGS. 5 to 1I illustrate a semiconductor structure at various stages according to some embodiments. In some embodiments, the semiconductor device shown in FIGS. 5 to 11 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multigate FETs, bipolar transistors, high voltage transistors, high frequency transistors, other memory cells, and combinations thereof.

Reference is made to FIG. 5. A substrate 310 is provided. The substrate 310 may be a wafer, and has a center region Wc and a peripheral region Wp. For example, the center region Wc is surrounded by the peripheral region Wp. In some embodiment, the center region Wc of the substrate 310 corresponds to the center region Wc of the wafer W in FIGS. 1, 2, and 4A-4C, and the peripheral region Wp of the substrate 310 corresponds to the peripheral region Wp of the wafer W. The center region Wc and the peripheral region Wp may be located in different dies of the wafer W.

In some embodiments, the substrate 310 includes silicon. Alternatively, the substrate 310 may include germanium, silicon germanium, gallium arsenide or other appropriate semiconductor materials. Also alternatively, the substrate 310 may include an epitaxial layer. For example, the substrate 310 may have an epitaxial layer overlying a bulk semiconductor. Further, the substrate 310 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 310 may include a semiconductor-on-insulator (SOI) structure. Also alternatively, the substrate 310 may include a buried dielectric layer, such as a buried oxide (BOX) layer, such as that formed by separation by implantation of oxygen (SIMOX) technology, wafer bonding, SEG, or other appropriate method.

In the present embodiment, as shown in FIG. 5, a first dielectric layer 312, a conductive layer 314, an etch stop layer 316, a second dielectric layer 318, and a transfer layer 319 are formed above the substrate 310. The conductive layer 314 is disposed in the first dielectric layer 312. In some embodiments, the first dielectric layer 312 may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), $SiO_xC_y$, $SiO_xC_yH_z$, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). The conductive layer 314 may be formed by etching the first dielectric layer 312 to form an opening and then filling the conductive materials (e.g., metal) in the via hole.

The etch stop layer 316 is formed over the first dielectric layer 312 and the conductive layer 314. In some embodiments, the etch stop layer 316 is formed of $Si_3N_4$. In some other embodiments, the etch stop layer 316 includes materials such as oxynitrides. In yet some other embodiments, the etch stop layer 316 may have a composite structure including a plurality of layers, such as a silicon nitride layer overlying a silicon oxide layer, or a combination of a first metal oxide layer, a carbide layer (e.g., oxygen-doped silicon carbide) over the first metal oxide layer, and a second metal oxide layer over the carbide layer. The etch stop layer 316 can be formed using plasma enhanced CVD (PECVD), however, other suitable methods, such as low pressure CVD (LPCVD), atomic layer deposition (ALD), and the like, can also be used.

The second dielectric layer 318 is formed over the etch stop layer 316. In some embodiments, the second dielectric layer 318 may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), $SiO_xC_y$, $SiO_xC_yH_z$, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). In some embodiments, the second dielectric layer 318 and the first dielectric layer 312 include the same materials.

The transfer layer 319 is formed over the second dielectric layer 318. In some embodiments, the transfer layer 319 can prevent the underlying second dielectric layer 318 from being damaged by following processes. In some embodiments, the transfer layer 319 is made of tetraethylorthosilicate (TEOS)-formed oxide, or other suitable materials.

Figure 6:
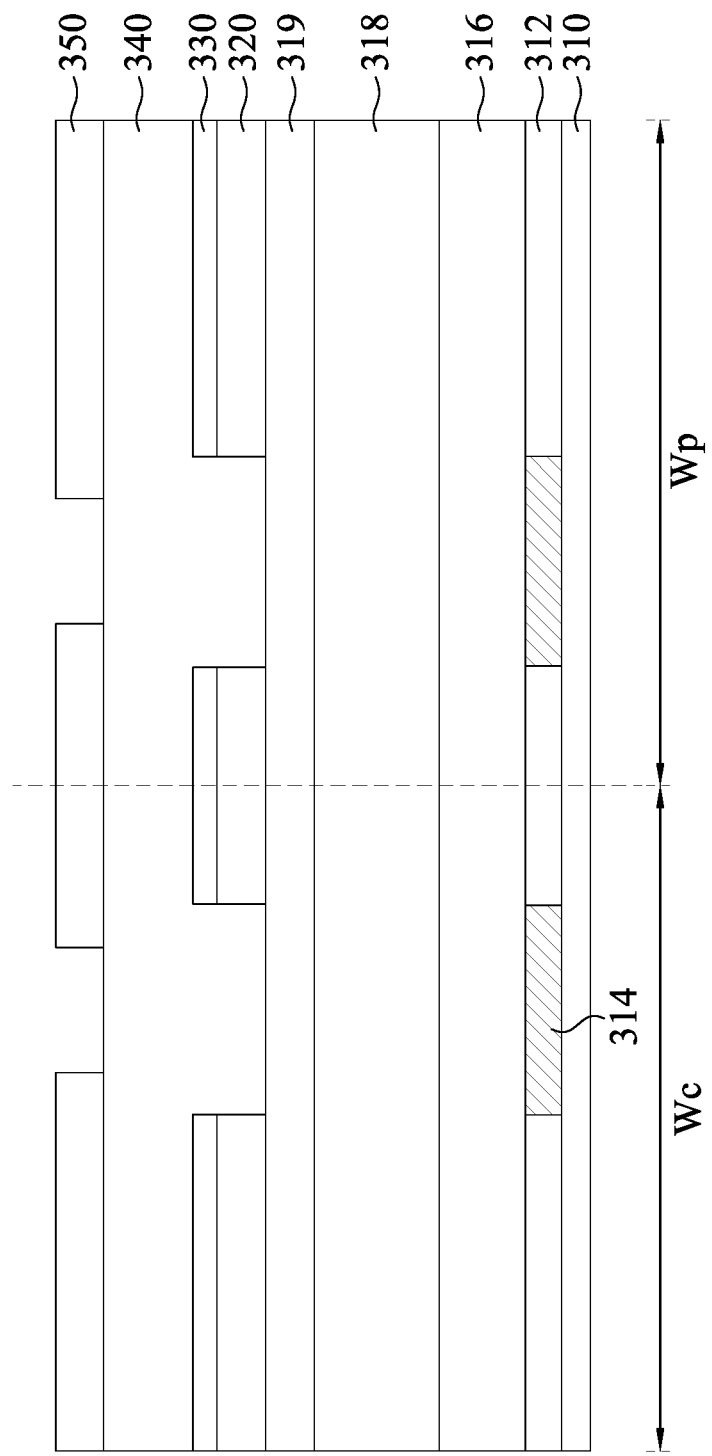

Reference is made to FIG. 6. A mask layer 320 is formed over a top surface 311 of the transfer layer 319. In some embodiments, the mask layer 320 includes nitride. For example, the mask layer 320 is made of silicon nitride (SiN) or titanium nitride (TiN). However, other materials, such as SiON, silicon carbide, or combinations thereof, may also be used. The mask layer 320 may be formed by a process such as chemical vapor deposition (CVD), plasma enhanced chemical vapor deposition (PECVD), or low pressure chemical vapor deposition (LPCVD).

A protective layer 330 is formed over the mask layer 320. The protective layer 330 can prevent the mask layer 320 from being damaged by following processes. In some embodiments, the protective layer 330 is made of tetraethylorthosilicate (TEOS)-formed oxide, or other suitable materials. In some embodiments, the protective layer 330 and the transfer layer 319 include the same materials. Once formed, the mask layer 320 and the protective layer 330 are patterned through suitable photolithographic and etching processes to form openings over the top surface 311 of the transfer layer 319.

A bottom layer 340 is formed over the top surface 311 of the transfer layer 319. The bottom layer 340 covers top surfaces of the mask layer 320 and the protective layer 330 and also sidewalls of the mask layer 320 and the protective layer 330. In some embodiments, the bottom layer 340 includes polymer and is a resist layer.

A patterned mask 350 is formed over the bottom layer 340. In some embodiments, the patterned mask 350 includes nitride. For example, the patterned mask 350 is made of silicon nitride (SiN) or titanium nitride (TiN). However, other materials, such as SiON, silicon carbide, or combinations thereof, may also be used. The patterned mask 350 may be formed by a process such as chemical vapor deposition (CVD), plasma enhanced chemical vapor deposition (PECVD), or low pressure chemical vapor deposition (LPCVD). Alternatively, the patterned mask 350 may be made of a silicon oxide and then converted to SiN by nitridation.

Figure 7:
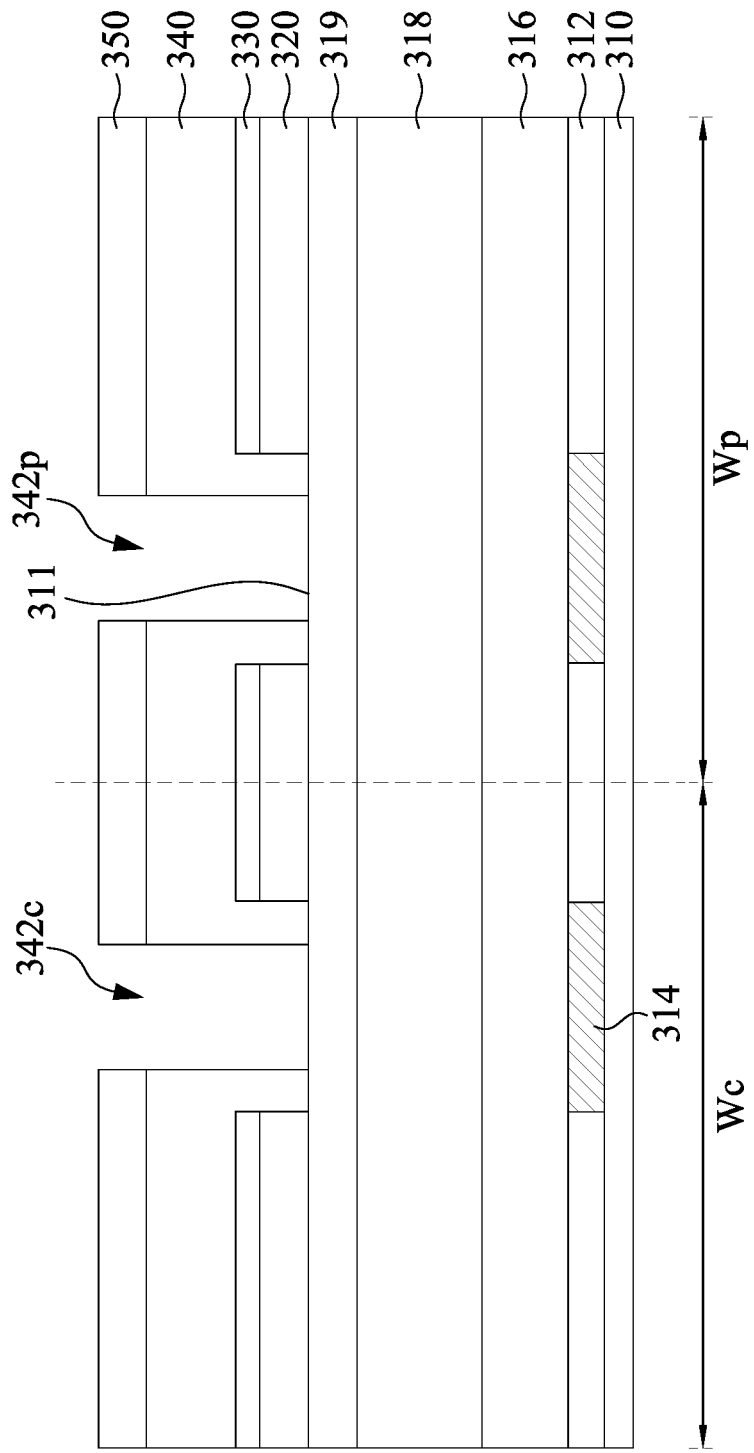

Reference is made to FIG. 7. Once formed, the bottom layer 340 is patterned through suitable photolithographic and etching processes to form openings 342c and 342p over the top surface 311 of the transfer layer 319. In some embodiments, the bottom layer 340 is patterned by using the plasma processing apparatus 100 of FIG. 1. For example, the structure of FIG. 6 is deposited on the pedestal 120 of the plasma processing apparatus 100 (operation 210 of FIG. 3). Subsequently, plasma is formed in the processing chamber 110 (operation 220 of FIG. 3). In some embodiments, due to the thickness changes of the focus ring 124, the plasma concentration/direction may be different between the center region Wc and the peripheral region Wp. As such, the plasma direction at the peripheral region Wp is tuned according to the thickness of the focus ring 124.

Figure 12:
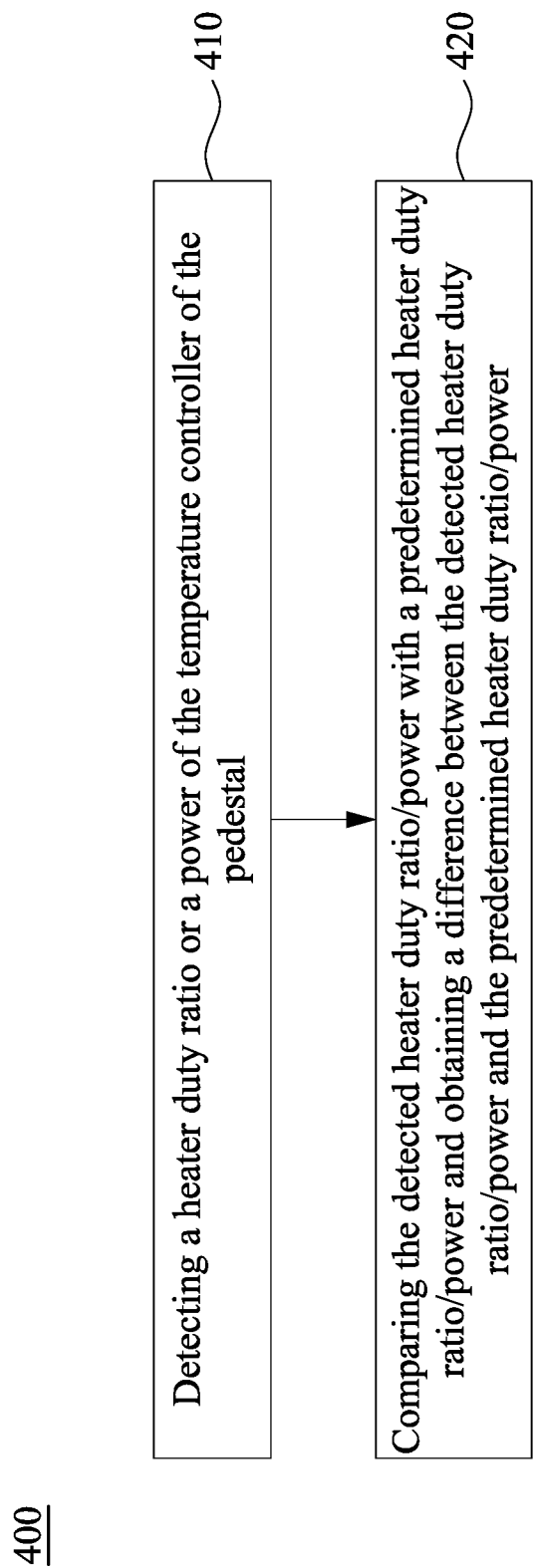
FIG. 12 is a flow chart of a method of an etching process in accordance with some embodiments of the present disclosure.

In some embodiments, the thickness of the focus ring 124 can be obtained from the heater duty ratio or a power of the temperature controller 190 of the pedestal 120. FIG. 12 is a flow chart of a method 400 of an etching process in accordance with some embodiments of the present disclosure. In operation 410 of method 400, a heater duty ratio or a power of the temperature controller of the pedestal is detected. For example, in FIG. 2, the temperature controller 190 includes a first heater 192 and a second heater 194. In some embodiments, the heater duty ratio or the power of the first heater 192 is detected. In some other embodiments, the heater duty ratio or the power of the second heater 194 is detected. As mentioned above, the heater duty ratio or the power of the temperature controller 190 reflects the thickness of the focus ring 124, such that the thickness of the focus ring 124 can be obtained from the heater duty ratio or the power of the temperature controller 190. In some embodiments, detecting the power of the temperature controller in the operation 410 of FIG. 12 is performed prior to forming the plasma in the processing chamber in the operation 220 of FIG. 3. In some other embodiments, detecting the power of the temperature controller in the operation 410 of FIG. 12 is performed after forming the plasma in the processing chamber in the operation 220 of FIG. 3.

In operation 420 of method 400, the detected heater duty ratio/power is compared with a predetermined heater duty ratio/power (as mentioned above) and a difference between the detected heater duty ratio/power and the predetermined heater duty ratio/power is obtained. For example, the detected heater duty ratio/power is greater than the predetermined heater duty ratio/power. That is, as the thickness of the focus ring decreases, the detected heater duty ratio/power increases.

After the operation 420 of method 400, the method 400 proceeds to operation 230 (see FIG. 3) where a plasma direction of the processing chamber 110 above a peripheral region Wp of the wafer W is tuned according to a thickness of a focus ring 124 of the processing chamber 110.

Figure 13:
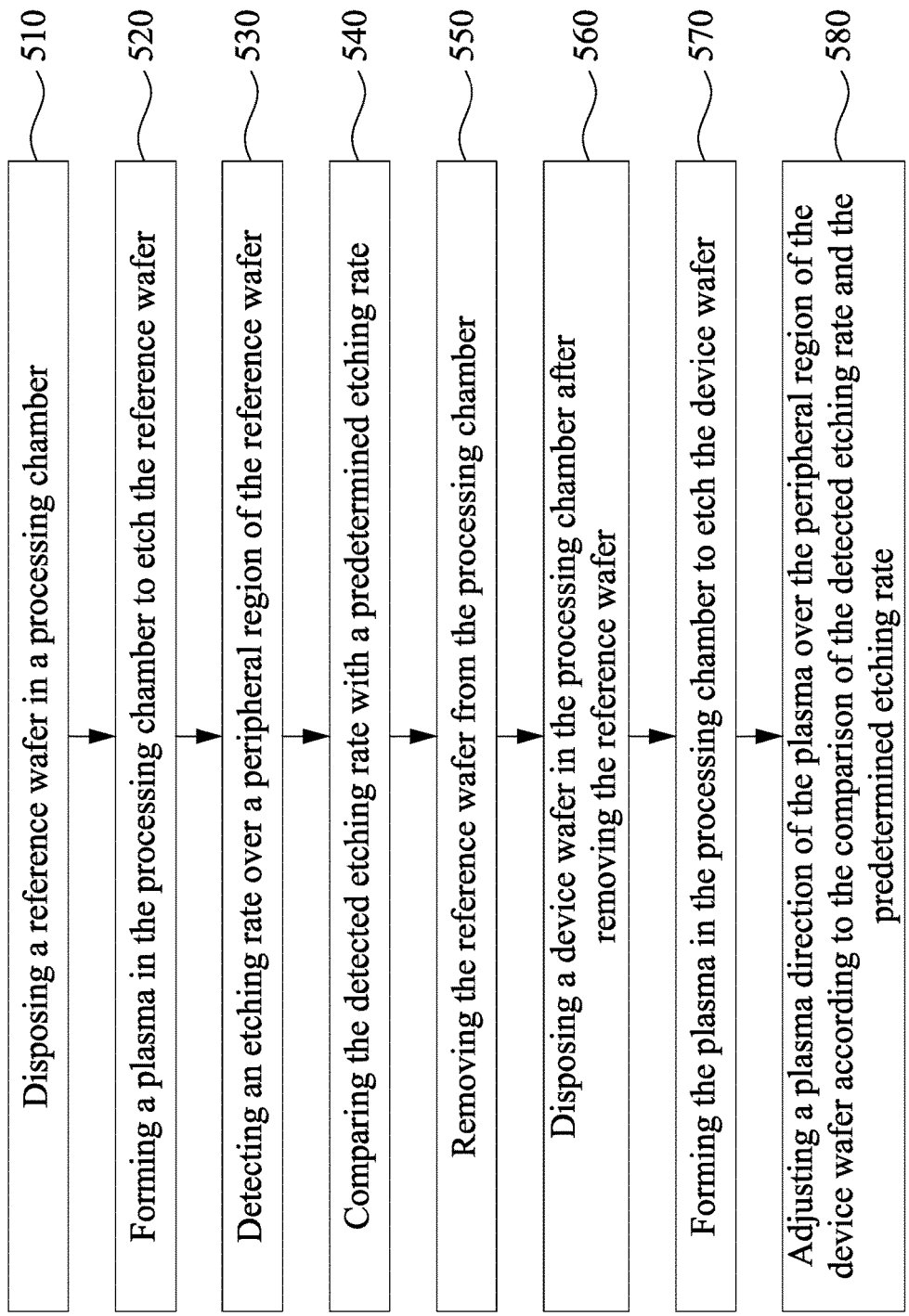
FIG. 13 is a flow chart of a method of an etching process in accordance with some embodiments of the present disclosure.

In some other embodiments, the thickness of the focus ring 124 can be obtained from the etching rate or etching direction of trenches/openings formed at the peripheral region Wp of the wafer W in FIG. 1. FIG. 13 is a flow chart of a method 500 of an etching process in accordance with some embodiments of the present disclosure. In operation 510 of method 500, a reference wafer in a processing chamber is detected. Specifically, prior to processing the wafer of FIG. 6, the reference wafer (such as a testing wafer or a previously processed wafer and can be labeled as W in some embodiments) is deposited on the pedestal 120 that is in the processing chamber 110.

In operation 520 of method 500, a plasma in the processing chamber is formed to etch the reference wafer. For example, in FIG. 1, the plasma P in the processing chamber 110 is formed to etch the reference wafer W.

In operation 530 of method 500, an etching rate over a peripheral region of the reference wafer is detected. In some embodiments, in FIG. 1, the sensing module 170 is configured to detect the etching rate over the peripheral region Wp of the reference wafer W. In some other embodiments, the etching rate of the peripheral region Wp of the reference wafer W can be interpreted by detecting a depth of trenches (e.g., trenches 360c and 360p in FIG. 9) in etching process.

In operation 540 of method 500, the detected etching rate is compared with a predetermined etching rate. In some embodiments, in FIG. 1, if the detected etching rate is lower than the predetermined etching rate, the edge electric field generator 126 is applied to adjust the plasma direction such that the plasma concentration over the peripheral region Wp of the reference wafer W is substantially equal to the plasma concentration over the central region Wc of the wafer W. In other words, the reference wafer W is etched before the plasma concentration/direction of the plasma processing apparatus 100 is tuned. As such, at least one trench or opening (e.g., trenches 360c and 360p in FIG. 9) is formed at the peripheral region Wp of the reference wafer W. The etching depth/orientation of the trench or opening (e.g., trenches 360c and 360p in FIG. 9) is measured and is compared with the predetermined etching depth/orientation of a trench or opening, which is etched by using a plasma processing apparatus 100 including a focus ring 124 having an initial thickness, which may be a thickness of a brand new focus ring or a known thickness of a focus ring. Thereafter, a difference between the etching depth/orientation of the trench or opening of the reference ring and the predetermined etching depth/orientation is obtained.

In operation 550 of method 500, the reference wafer is removed from the processing chamber. In operation 560 of method 500, a device wafer (such as the wafer in FIG. 6) is disposed in the processing chamber after removing the reference wafer. For example, in FIG. 1, the reference wafer is the testing wafer and is removed after comparing the detected etching rate with the predetermined etching rate. Thereafter, the reference wafer is replaced with the device wafer W in the processing chamber 110.

In operation 570 of method 500, the plasma in the processing chamber is formed to etch the device wafer. For example, in FIG. 1, the plasma P in the processing chamber 110 is formed to etch the device wafer W. In some embodiments, the operation 570 of method 500 in FIG. 13 is similar to or substantially the same as the operation 220 of method 200 in FIG. 3.

In operation 580 of method 500, a plasma direction of the plasma over the peripheral region of the device wafer is adjusted according to the comparison of the detected etching rate and the predetermined etching rate. As such, the detected etching rate is increased and substantially equal to the predetermined etching rate. In some embodiments, in FIG. 1, a plasma concentration over the peripheral region Wp of the device wafer W is substantially equal to a plasma concentration over a central region Wc of the device wafer W, and the central region Wc of the device wafer W is adjacent to the peripheral region Wp of the device wafer W. In some embodiments, the operation 580 of method 500 in FIG. 13 is similar to or substantially the same as the operation 230 of method 200 in FIG. 3.

Subsequently, in operation 230 of method 200, the plasma concentration/direction of the plasma processing apparatus is tuned according to the thickness of the focus ring. In some embodiments, the thickness of the focus ring is obtained from the detected heater duty ratio/power. When the difference between the detected heater duty ratio/power and the predetermined heater duty ratio/power is obtained, the edge electric field generator 126 provides a voltage in the focus ring 124, such that an electrical field is formed above the focus ring 124 to tune the plasma concentration/direction directly above the focus ring 124. The value of voltage is determined from the difference between the detected heater duty ratio/power and the predetermined heater duty ratio/power. For example, as the difference increases, the voltage increases accordingly.

In some other embodiments, the thickness of the focus ring is obtained from the etching depth/orientation of the aforementioned reference wafer. When the difference between the etching depth/orientation of the reference ring and the predetermined etching depth/orientation is obtained, the edge electric field generator 126 provides a voltage in the focus ring 124, such that an electrical field is formed above the focus ring 124 to tune the plasma concentration/direction directly above the focus ring 124. The value of voltage is determined from the difference between the etching depth/orientation of the reference ring and the predetermined etching depth/orientation. For example, as the difference increases, the voltage increases accordingly.

Subsequently, in operation 240 of method 200, the etching process in FIG. 7 is performed by using the tuned plasma. As such, the profile of the opening 342p can be substantially the same as the profile of the opening 342c. Or, the profile of the opening 342p can be constant under different thicknesses of the focus ring 124.

Figure 8:
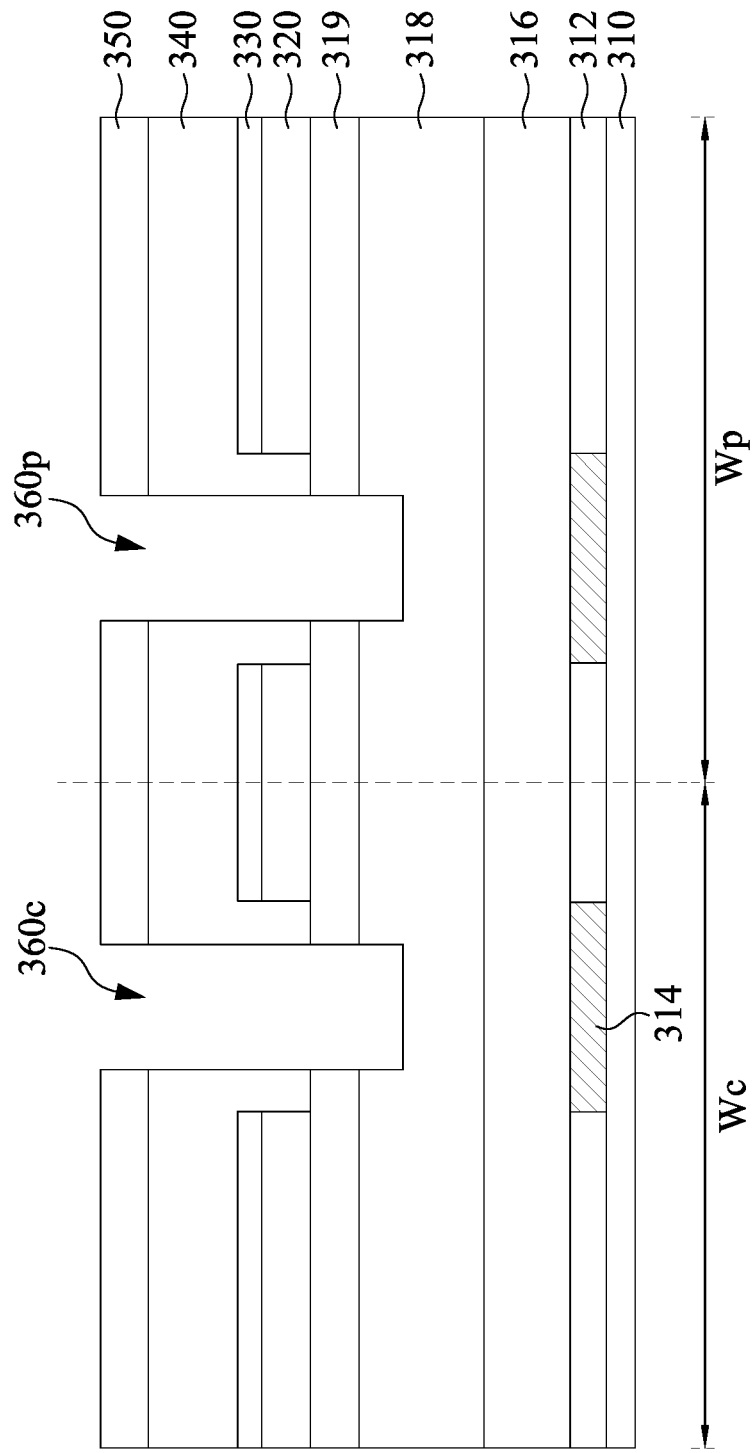

Reference is made to FIG. 8. Portions of the transfer layer 319 and the second dielectric layer 318 are etched, such that at least one trench 360c is formed in the center region Wc of the substrate 310, and at least one trench 360p is formed in the peripheral region Wp of the substrate 310. The exposed portions of the transfer layer 319 and a portion of the second dielectric layer 318 are removed by an etching process, such as reactive ion etching (RIE), in order to form the trenches 360c and 360p in the substrate 310. In some embodiments, the semiconductor device is a fin field effect transistor (FinFET), and the trenches 360c and 360p are configured to separate adjacent two semiconductor fins formed in the substrate 310.

In some embodiments, the etching process (e.g., the reactive ion etching process) of FIG. 8 is performed by using the plasma processing apparatus 100 of FIG. 1 and using the operation 240 of FIG. 3. In some embodiments, the structure of FIG. 7 is deposited on the pedestal 120 of the plasma processing apparatus 100 as shown in the operation 210. The plasma is formed as shown in the operation 220 of FIG. 3. After the operation 220, the operation 230 is proceeded where the plasma direction of the processing chamber 110 above the peripheral region Wp of the wafer W is tuned according to the thickness of the focus ring 124 of the processing chamber 110. Since the details of the etching process of FIG. 8 by using the plasma processing apparatus 100 is similar to or substantially the same as the aforementioned etching process of FIG. 7, the description of the etching process of FIG. 8 is not repeated herein.

Figure 9:
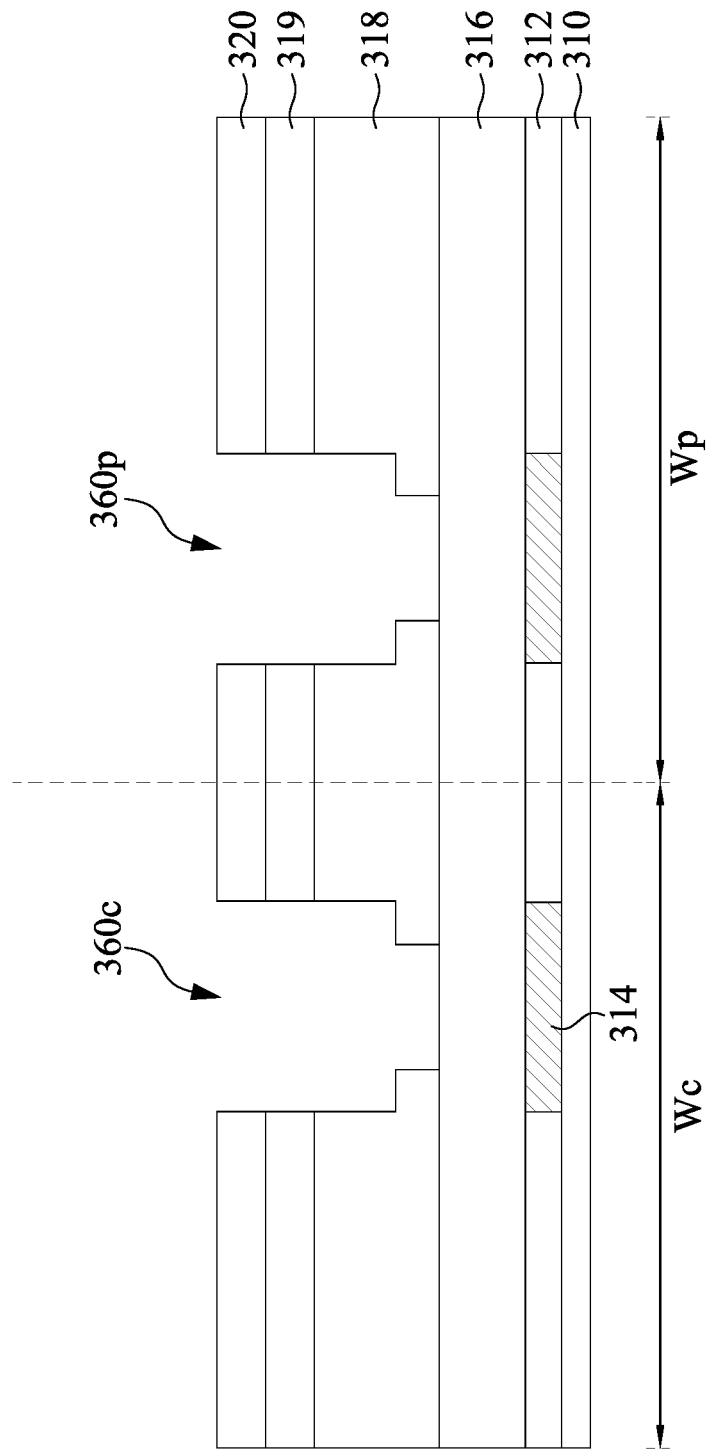

Reference is made to FIG. 8 and FIG. 9. The patterned mask 350 is removed. In some embodiments, removing the patterned mask 350 may be performed by using a photoresist strip process, such as an ashing process, and etching process, or other suitable processes. After the patterned mask 350 is removed, the bottom layer 340 is removed. In some embodiments, the bottom layer 340 is removed by performing an etching process. The etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

In some embodiments, the etching process of FIG. 9 is performed by using the plasma processing apparatus 100 of FIG. 1 and using the operation 240 of FIG. 3. In some embodiments, the structure of FIG. 8 is deposited on the pedestal 120 of the plasma processing apparatus 100 as shown in the operation 210. The plasma is formed as shown in the operation 220 of FIG. 3. After the operation 220, the operation 230 is proceeded where the plasma direction of the processing chamber 110 above the peripheral region Wp of the wafer W is tuned according to the thickness of the focus ring 124 of the processing chamber 110. Since the details of the etching process of FIG. 9 by using the plasma processing apparatus 100 is similar to or substantially the same as the aforementioned etching process of FIG. 7, the description of the etching process of FIG. 9 is not repeated herein.

In some embodiments, when the bottom layer 340 is etched, a portion of the transfer layer 319 and a portion of the second dielectric layer 318 are etched by using the protective layer 330 and the mask layer 320 as etching masks, such that the trenches 360c and 360p in FIG. 8 are deepened to expose a top surface of the etch stop layer 316. Further, upper portions of the trenches 360c and 360p are widened during this etching process. In some embodiments, the upper portion of the trench 360c is wider and deeper than a lower portion of the trench 360c. Similarly, the upper portion of the trench 360p is wider and deeper than the lower portion of the trench 360p.

Figure 10:
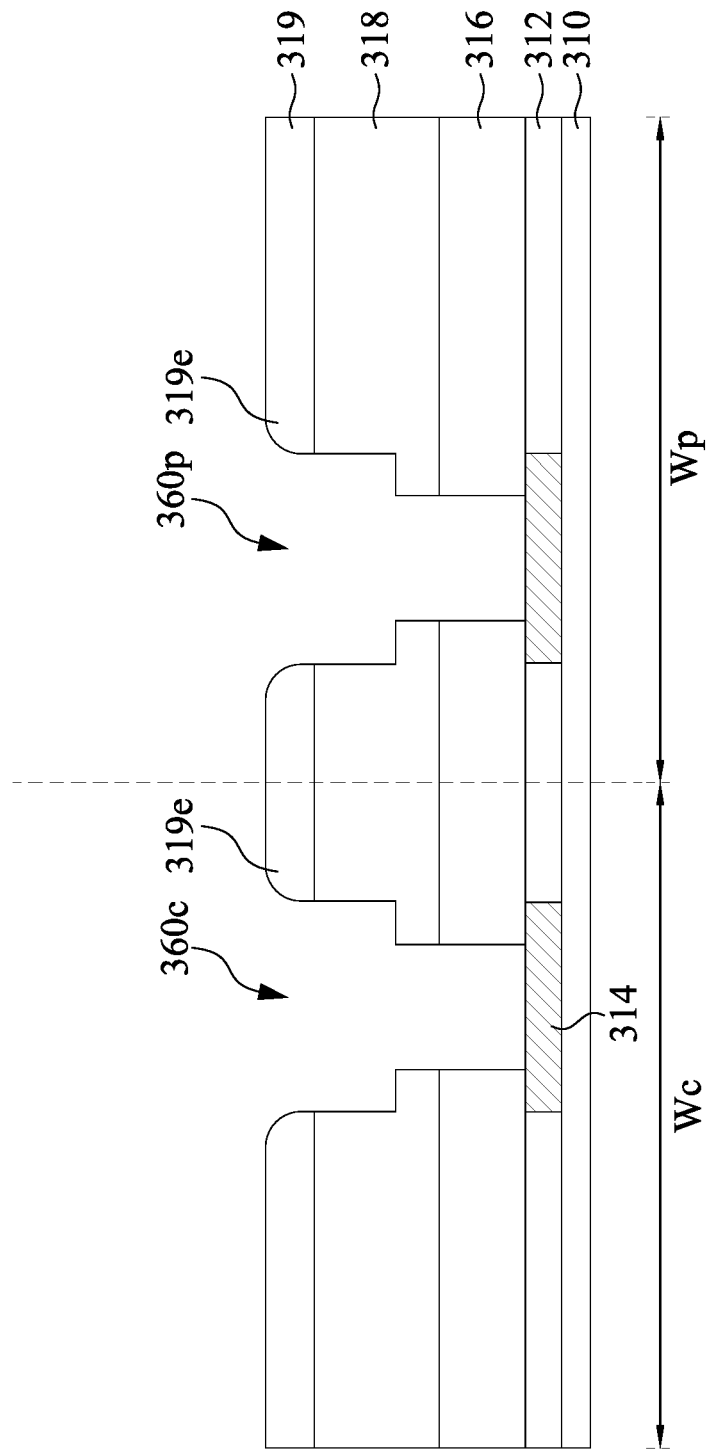

Reference is made to FIG. 9 and FIG. 10. The mask layer 320 is removed. In some embodiments, removing the mask layer 320 may be performed by using etching process, or other suitable processes. In some embodiments, the etch stop layer 316 is etched such that a top surface of the conductive layer 314 is exposed through the trenches 360c and 360p. In some embodiments, removing the mask layer 320 and etching the etch stop layer 316 are performed by one process. In other embodiments, removing the mask layer 320 and etching the etch stop layer 316 are performed by different processes. For example, after removing the mask layer 320, the etch stop layer 316 is etched to expose the conductive layer 314.

In some embodiments, the etching process of FIG. 10 is performed by using the plasma processing apparatus 100 of FIG. 1 and using the operation 240 of FIG. 3. In some embodiments, the structure of FIG. 9 is deposited on the pedestal 120 of the plasma processing apparatus 100 as shown in the operation 210. The plasma is formed as shown in the operation 220 of FIG. 3. After the operation 220, the operation 230 is proceeded where the plasma direction of the processing chamber 110 above the peripheral region Wp of the wafer W is tuned according to the thickness of the focus ring 124 of the processing chamber 110. Since the details of the etching process of FIG. 10 by using the plasma processing apparatus 100 is similar to or substantially the same as the aforementioned etching process of FIG. 7, the description of the etching process of FIG. 10 is not repeated herein.

In some embodiments, an edge portion 319e of the transfer layer 319 is etched when removing the mask layer 320. In some other embodiments, the edge portion 319e of the transfer layer 319 is etched when etching the etch stop layer 316. The edge portion 319e of the transfer layer 319 has a curved shape.

Figure 11:
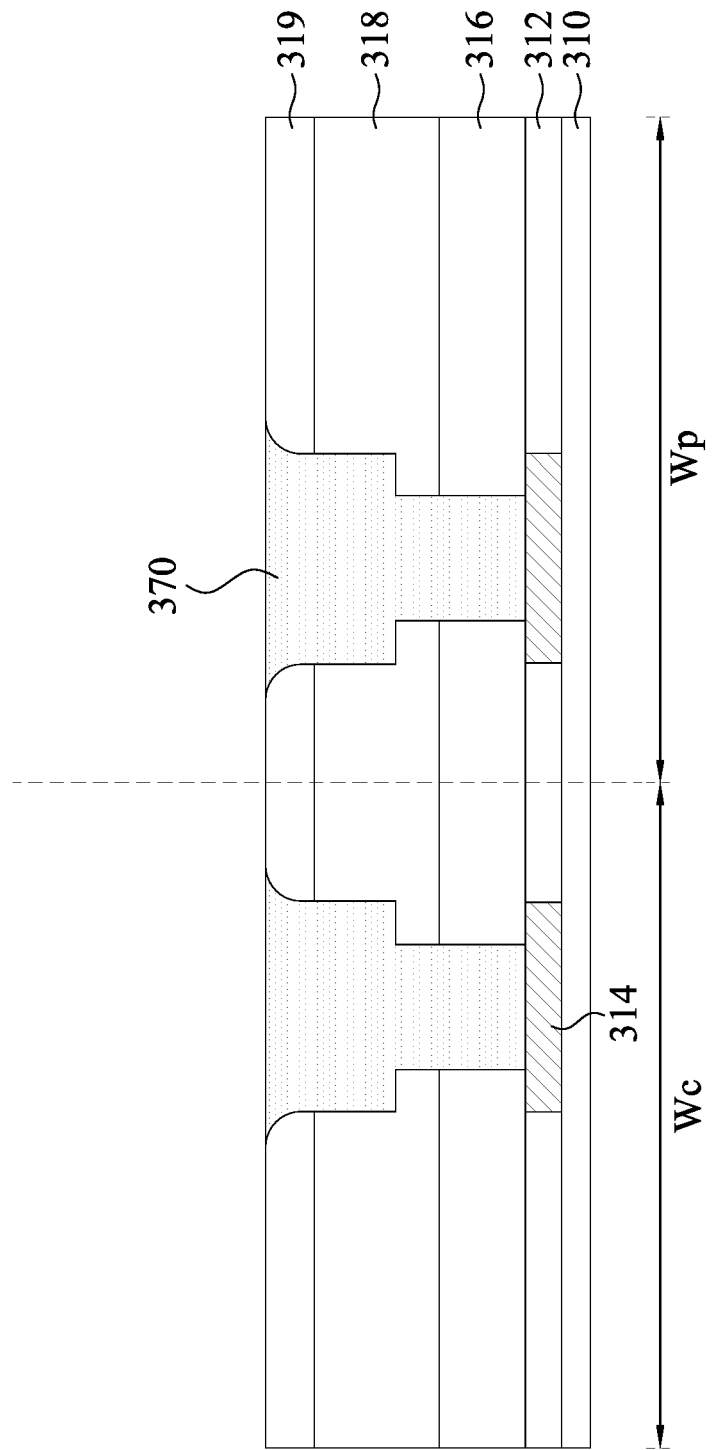

Reference is made to FIG. 10 and FIG. 11. Conductive features 370 are respectively formed in the trenches 360c and 360p. The conductive features 370 are in direct contact with the conductive layers 314. In some embodiments, the conductive features 370 may include tungsten (W), Mo, Ru, other metal, or other suitable conductive materials. The conductive features 370 may be deposited by ALD, PVD, CVD, or other suitable process.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the etching profiles of the wafer at center region and at peripheral region can be uniform because of tuned plasma direction. Another advantage is that increased throughput and hence reduced fabrication cost can be provided, because the yield is raised. Yet another advantage is that desired plasma direction can be achieved, because the edge electric field generator can tune the electric field around the peripheral region of the wafer.

According to some embodiments, a method for manufacturing a semiconductor structure includes a wafer in a processing chamber, in which the wafer is laterally surrounded by a focus ring. A plasma is formed in the processing chamber to process the wafer. A thickness of the focus ring is detected. A plasma direction of the plasma over a peripheral region of the wafer is adjusted according to the thickness of the focus ring.

According to some embodiments, a method for manufacturing a semiconductor structure includes a reference wafer in a processing chamber. A plasma is formed in the processing chamber to etch the reference wafer. An etching rate over a peripheral region of the reference wafer is detected. The detected etching rate is compared with a predetermined etching rate. The reference wafer is removed from the processing chamber. A device wafer is disposed in the processing chamber after removing the reference wafer. The plasma is formed in the processing chamber to etch the device wafer. A plasma direction of the plasma over the peripheral region of the device wafer is adjusted according to the comparison of the detected etching rate and the predetermined etching rate.

According to some embodiments, a method for manufacturing a semiconductor structure includes a wafer on a pedestal in a processing chamber. A plasma is formed in the processing chamber to process the wafer. The wafer is heated by using a temperature controller configured to control a temperature of the pedestal. A heater duty ratio of the temperature controller is detected. A plasma direction of the plasma over a peripheral region of the wafer is adjusted according to the heater duty ratio of the temperature controller.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    disposing a wafer in a processing chamber, wherein the wafer is laterally surrounded by a focus ring, disposing the wafer in the processing chamber comprises disposing the wafer on a pedestal;
    forming a plasma in the processing chamber to process the wafer;
    detecting a thickness of the focus ring, wherein detecting the thickness of the focus ring comprises detecting a power of a temperature controller configured to control a temperature of the pedestal; and
    adjusting a plasma direction of the plasma over a peripheral region of the wafer according to the thickness of the focus ring.

2. The method of claim 1, wherein detecting the power of the temperature controller is performed after forming the plasma in the processing chamber.

3. The method of claim 1, wherein forming plasma in the processing chamber to process the wafer comprises etching the wafer.

4. The method of claim 1, further comprising:
    heating the wafer by using the temperature controller configured to control the temperature of the pedestal.

5. The method of claim 1, wherein adjusting the plasma direction of the plasma over the peripheral region of the wafer comprises applying a voltage in the focus ring.

6. The method of claim 5, wherein forming plasma in the processing chamber to process the wafer comprises generating an RF electromagnetic field in the processing chamber.

7. A method, comprising:
    disposing a wafer on a pedestal in a processing chamber;
    forming a plasma in the processing chamber to process the wafer;
    heating the wafer by using a temperature controller configured to control a temperature of the pedestal;
    detecting a heater duty ratio of the temperature controller; and
    adjusting a plasma direction of the plasma over a peripheral region of the wafer according to the heater duty ratio of the temperature controller.

8. The method of claim 7, wherein disposing the wafer is such that the wafer is laterally surrounded by a focus ring, and detecting the heater duty ratio of the temperature controller comprises detecting the heater duty ratio of a heater of the temperature controller right under the focus ring.

9. The method of claim 7, wherein detecting the heater duty ratio of the temperature controller comprises detecting the heater duty ratio of a heater of the temperature controller right under the wafer.

10. The method of claim 7, wherein forming plasma in the processing chamber to process the wafer comprises generating an RF electromagnetic field in the processing chamber.

11. The method of claim 7, wherein adjusting the plasma direction of the plasma over the peripheral region of the wafer is performed such that a plasma concentration over the peripheral region of the wafer is substantially equal to a plasma concentration over a central region of the wafer, and wherein the central region of the wafer is adjacent to the peripheral region of the wafer.

12. The method of claim 7, wherein adjusting the plasma direction of the plasma over the peripheral region of the wafer comprises applying a voltage at a focus ring adjacent to the peripheral region of the wafer.

13. The method of claim 12, wherein adjusting the plasma direction of the plasma over the peripheral region of the wafer comprises determining a value of the voltage according to a difference between the detected heater duty ratio and a predetermined heater duty ratio.

14. A method, comprising:
    disposing a wafer on a pedestal in a processing chamber, wherein the wafer is laterally surrounded by a focus ring;

forming a plasma in the processing chamber to etch the wafer;
heating the wafer by using a temperature controller configured to control a temperature of the pedestal;
detecting a power of the temperature controller;
obtaining a thickness of the focus ring according to a difference between the power and a predetermined power; and
adjusting a plasma direction of the plasma over a peripheral region of the wafer according to the thickness of the focus ring.

15. The method of claim 14, wherein the focus ring comprises silicon.

16. The method of claim 14, wherein forming the plasma in the processing chamber to etch the wafer comprises generating an RF electromagnetic field in the processing chamber.

17. The method of claim 14, wherein adjusting the plasma direction over the peripheral region of the wafer is performed such that a plasma concentration over the peripheral region of the wafer is substantially equal to a plasma concentration over a central region of the wafer, and wherein the central region of the wafer is adjacent to the peripheral region of the wafer.

18. The method of claim 14, wherein the pedestal is an electrostatic chuck.

19. The method of claim 14, wherein adjusting the plasma direction over the peripheral region of the wafer comprises applying a voltage to the focus ring.

20. The method of claim 19, wherein adjusting the plasma direction of the plasma over the peripheral region of the wafer comprises determining a value of the voltage according to the thickness of the focus ring.

* * * * *